June 19, 1951

E. D. DAWSON 2,557,217

RADIO TUNING DRIVE MECHANISM

Filed Jan. 24, 1950

Inventor
Ernest D. Dawson

By H. W. Newton

Attorney

Patented June 19, 1951

2,557,217

UNITED STATES PATENT OFFICE 2,557,217

RADIO TUNING DRIVE MECHANISM

Ernest D. Dawson, Camden, N. J., assignor to Radio Corporation of America, a corporation of Delaware Application January 24, 1950, Serial No. 140,185

10 Claims. (Cl. 74—10.54)

This invention relates to radio tuning drive mechanisms of the general type ordinarily used to adjust variable tuning elements such as capacitors and inductances. In particularity this invention relates to a tuning drive mechanism of the type referred to, having a main tuning control means and a vernier tuning control means.

Radio receiving equipment and, in particular, television receivers are generally difficult to tune to any particular channel due to the fact that a large frequency range may be covered by the tuning system and a small displacement of the tuning control means therefore, may result in a wide frequency change or signal selection over a large number of channels. Furthermore, the problem is made more difficult because the tuning ratio of such a control means has to be made large enough so that the entire tunable frequency spectrum may be covered with a relatively small movement.

To enable fine tuning to a particular channel, it has been customary to provide relatively slow motion drive or control means of some character between the main operating control and the tuning elements actuated thereby. Such slow motion drive or control means, however, adds considerably to the expense of the receiver, especially when made so that there is no backlash therein. In addition, added slow motion drive means generally interferes with rapid shifts of the main operating control when tuning between widely separated frequencies.

Mechanically, fine tuning mechanisms are relatively expensive to construct and complicated in design. The manufacturing tolerances are necessarily close to prevent backlash when such mechanisms are constructed and adapted to turn in two directions. In addition, friction drive belts and discs used in certain known devices and mechanisms do not afford positive driving means for these controls, and complicated stop mechanisms increase the cost of this vernier type drive means. In general, prior art tuner drive means fail adequately to provide a single tuning mechanism which gives both straight line and rotary tuning motion.

In general, vernier tuning control means must provide repeated accurate adjustment of the tuning system, and should be smooth in operation. Many problems are encountered in designing a tuning mechanism having all the heretofore mentioned desired features and having a relatively low cost. It is desirable, from the cost standpoint, to provide a drive mechanism having all parts constructed of either simple sheet metal stampings or cylindrical parts, thereby avoiding the necessity for using relatively expensive die castings or mechanical gears and similar elements.

The difficulty in providing a practicable mechanical tuning arrangement with a combined vernier control is evidenced by the almost exclusive use of separate vernier tuning elements and novel band spread circuits with radio receiving equipment embodying a vernier tuning control, rather than a vernier drive control associated with the main tuning drive mechanism.

Physical mounting of the respective tuning elements with respect to the tuner mechanism affords a problem in the design of radio tuning apparatus. It is generally desirable to mount the tuning elements at a point remote from the tuner driving member. If a driving member were provided which could be easily linked to a remote tuning element, a single mechanism could be used with a variety of models by merely changing the particular linkage between the driver and the tuner.

It is, therefore, an object of the invention to provide a tuning mechanism which may easily be linked to a tuning element remote from the actual driving member.

It is a general object of this invention to provide a simplified tuning drive mechanism which substantially obviates the aforementioned and other inadequacies of the prior known tuning control systems.

Another object of this invention is to provide a radio tuning mechanism which readily provides tuning movement over a large frequency spectrum, while at the same time providing vernier movement to any narrow channel within said spectrum.

It is a further object of this invention to provide a simplified, easily manufactured vernier drive mechanism which uses no gearing, friction drive belts, or the like, and yet involves no critical adjustments or backlash in operation.

A still further object of this invention is to provide a tuning mechanism which permits tuning a radio receiver to any selected channel within a relatively wide, continuously tunable frequency spectrum, rapidly and easily, and which conjointly affords vernier tuning within a selected channel.

Other objects of the invention will become apparent from the detailed description contained in the specification when considered in conjunction with the accompanying drawings.

A tuning control system in accordance with the invention, includes a single tuning mechanism for rapidly tuning a radio receiver over a large portion of the radio frequency spectrum and for vernier tuning over any selected relatively narrow band within the frequency spectrum. Such a mechanism is useful in selectively tuning radio receivers rapidly over a frequency spectrum, which includes for example the general television broadcast bands presently assigned in the United States, and in tuning within a particular selected channel to a broadcast frequency to which a particular television transmission signal is assigned. With the tuning mechanism of the present invention, a particular channel may be selected by a main tuning control, the desired signal or station within the channel may be selected by means of a separate vernier tuning control which is conjointly operative to control the same tuning means.

In accordance with the invention, a main tuning control is provided to quickly select the particular desired channel, and cooperative therewith in connection with a common tuning means, a novel vernier adjustment is provided which will permit accurate tuning to a desired signal or station by the use of the main tuning control mechanism. In high frequency equipment, particularly of the type used for television, the desired tunable frequency spectrum is so large with respect to the channel width that it is extremely difficult to accurately tune to a signal within the channel by means of a single operating mechanism having both a vernier and main control means, without providing such a slow tuning ratio that selection of the channels is too slow when using the main control means. The use of the vernier arrangement in the present invention does not impede the main drive tuning, yet it does not require additional tuning mechanisms other than a unitary control means.

Figures 1, 2, 3, 3A, 4:
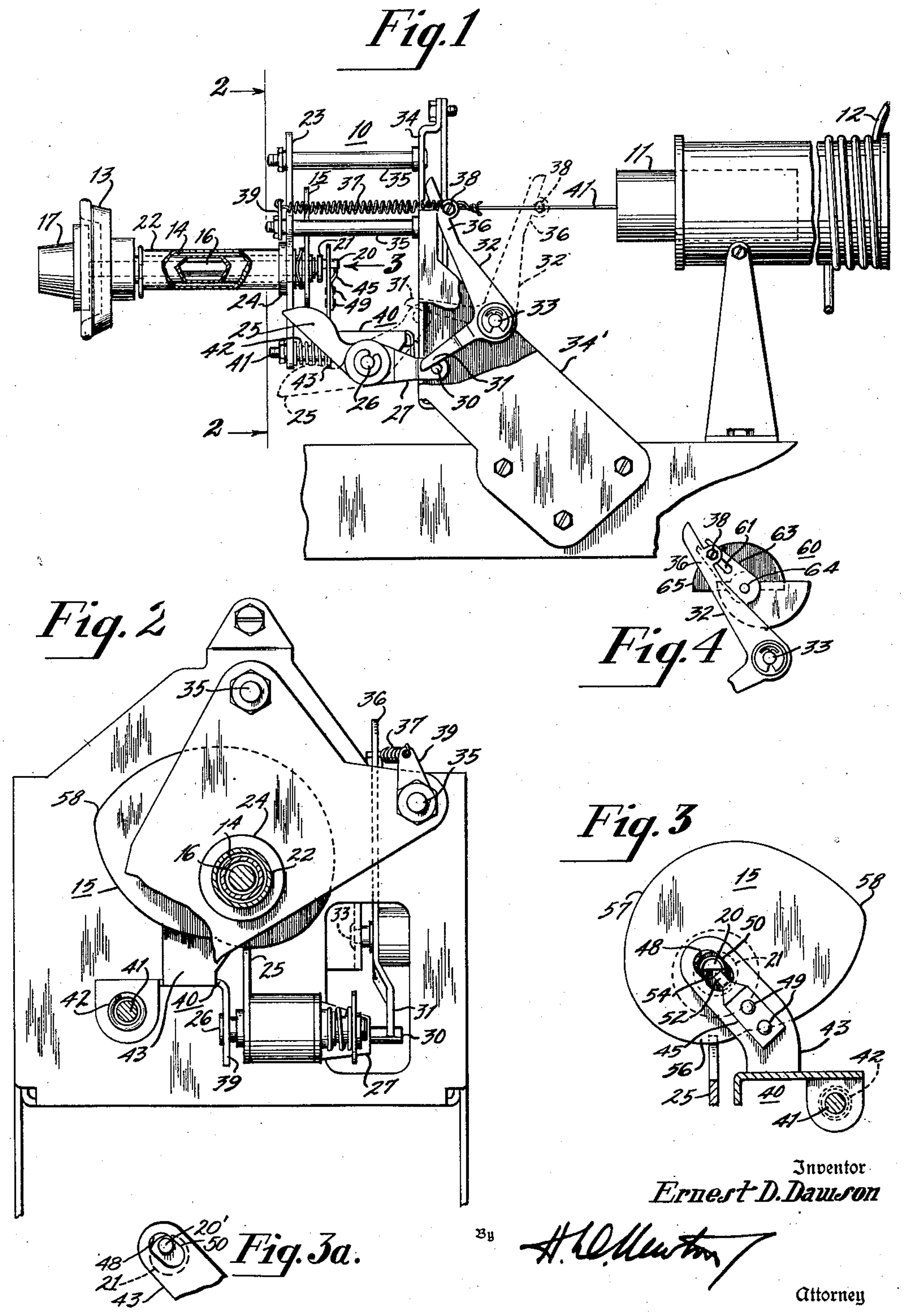
Figure 1 is a side view, with certain parts broken away, showing a tuning mechanism embodying the invention.
Figure 2 is a front view of the mechanism of Figure 1, taken in the direction of the arrows, along the line 2—2 of Figure 1.

Figures 3 and 3*a* are views in elevation and partly in section of portions of the tuning mechanism as shown in Figure 1, looking along the line 3; and Figure 4 is a view in elevation of a detail modification of the invention as applied to the mechanism shown in Figures 1, 2 and 3.

Referring in detail to the respective figures of the drawing, in which like reference characters represent like parts throughout, there is shown in Figure 1 a tuner mechanism 10 which is connected to actuate a movable tuning element or elements of a tuning system through a desired range of movement. In the present example the mechanism is connected to a core 11 of a variable inductance winding 12 such as is used in a radio receiver circuit and which represents any suitable tuning means.

Further in accordance with the invention, a main tuning drive control knob 13 is connected by means of a hollow drive shaft 14 to a disc type cam 15. A second and vernier drive shaft 16 is concentrically arranged within the hollow shaft 14, thereby connecting a vernier tuning control knob 17 to a stud or lug 20 eccentrically disposed about the end of the vernier drive shaft 16 on a cylindrical head or disc 21. A hollow bushing or sleeve 22 concentrically encloses both shafts and is affixed to a frame member 23 by means of a peened boss 24, or the like.

A cam follower or rocker arm 25 in the form of a first class lever rides on the cam member 15 at right angles and is pivoted about a shaft or spindle 26. The free arm 27 of the cam follower lever has an extended or protruding portion thereon which, in this embodiment, is shown as a rod or stud 30, upon which rides or is connected an arm 31 of a lever linkage system, which connects the tuning cam or drive means with the variable inductor 12, or a similar controlled member. The extended portion 30 may be constructed by simply pressing the end of the lever arm 27 into proper shape. Should this be done, the contact surface is preferably hardened to prevent excessive wear. All the contact portions, such as the cam periphery and the cam follower surface, are also preferably hardened or heat treated to provide a better wearing surface.

The lever system in the shown preferred embodiment, comprises a single first class lever 32 pivoted about a pin 33 located at its fulcrum, and mounted in a plane substantially parallel to that of the cam follower lever 25. The linkage lever 32 is pivoted about a point 33 on an extension 34 extending substantially perpendicular from a second frame member 34 which is substantially parallel with the first frame member 23 and spaced from the first frame member 23 by means of bolts 35 or the like. The free arm 36 of the linkage lever 32 is biased in this particular embodiment by means of a spring 37 having one end mounted at a fixed point 38 on the arm 36 and having its other end attached to the first frame member 23 by a clip 39, or the like. The movable tuning core 11 is also attached to the linkage lever at the point 38 on the linkage lever arm 31 by means of a connecting rod or semi-flexible wire 41 or some other linkage means which may be extended to provide a connection of any reasonable or desired length.

As the linkage lever 32 pivots about its fulcrum point 33 upon rotation of the main drive control means 13 and corresponding rotation of the cam member 15, the tuning core is moved in and out with respect to the inductance 12, between limits as indicated in the drawing by the dotted and full line positions of the linkage system. The single spring 37 is used to bias the linkage lever member 32 in a counterclockwise direction about its fulcrum 33, thereby urging the contact arm 31 firmly into contact with the pivoted cam follower lever at the stud 30, and accordingly urging the cam follower lever 25 in a clockwise direction firmly forcing it into contact with the cam 15. With such an arrangement, cooperative relationship of the several parts in positive and firm contact is easily maintained and no backlash will be encountered upon changing the direction of rotation of the cam 15.

Manufacturing tolerances of the movable elements are not critical, and all the parts are simply constructed by stamping metal sheets or forming simple turned cylindrical members. In addition, a minimum of parts is required in the described tuning mechanism, thereby cutting manufacturing and assembly costs.

Vernier tuning of the inductance 12 is accomplished by the same lever linkage system which connects the tuner core 11 to the main drive means through the cam follower 25. For this purpose the cam follower fulcrum shaft or rod 26 is mounted on a pivoted vernier lever arm 39 (shown better in Figure 2). The entire vernier lever member 40 is pivoted about metal rod 41 in this embodiment shown at right angles to the vernier pivot 26. This pivot may be similar to the bolts 35 between the two frame members 23, 34. A concentric spring 42 around the pivot shaft 41 forces the vernier lever member 40 against the second frame member 34, thereby keeping the lever in a fixed horizontal position on the shaft 41, and precluding any end play caused by normal tuning motion.

It is seen that a movement of the pivoted vernier lever 40 about its axis 41 will effect a movement of the cam follower lever 25 and accordingly the linkage lever 32 and will thereby move the tuning core 11 within the inductance 12. To utilize this effect, an arm 43 is provided on the vernier lever 30 to which a suitable vernier tuning control mechanism may be attached or connected. In this embodiment a mating slot 48 (shown in Figure 3) is provided for engaging the eccentric lug 20 attached to the vernier control shaft 16 and actuated by means of the vernier knob 17. The eccentricity of this lug 20 then will determine the amount of vernier movement imparted to the tuning core 11, as well as the multiplying factor of the vernier lever means 40.

The spring bias member 37 will urge one side 50 of the mating slot 48 against the eccentric lug 20 by forcing the vernier lever 40 downward as shown in the drawing, so that there can be no backlash in the vernier control movement. If a continually rotatable vernier adjustment is desired, the eccentric lug 20 may be a cylindrical rod. The shown embodiment is preferred, however, where a restricted range of motion is desired. This restricted movement is accomplished by forming the lug 20 of a half-rounded cylindrical projection or some other segmental or flattened lug portion and by adding a stop member 45 to engage the flat portion thereof at the ends of the desired restriction angle. This feature will be described more fully hereinafter.

The tuner mechanism described will operate any controlled member such as the tuning core 11 in straight line motion, and is provided with both a main tuning means and a vernier adjustment means, yet in this one simple, easily manufactured mechanism, a repeatedly accurate control is maintained without backlash or lost motion.

Figure 2 is a partially cut-away, sectional view of Figure 1 along the line 2—2, which shows the mode of operation of the pivoted vernier tuning mechanism. The pivot axis rod 41 of the vernier lever member 40 may be one of the frame bolts 35 as before described. Then the vernier eccentric lug 20 will act upon the lever arm 43 of the vernier member and pivot the other arm 39 of the vernier lever 40 about the fulcrum rod 41. One arm 25 of the cam follower lever, which is pivoted to the vernier lever by the pivot shaft 26, is in solid contact with the cam surface 15, and therefore, when the vernier lever arm 39 is moved, about its pivot, motion is imparted which will force the opposite cam follower arm 27 upward or downward (as shown in the drawing), thus forcing the linkage lever arm 31, which rides upon the protruding portion 30 of the cam follower lever rocker arm 27, to turn about the linkage pivot rod 33, thereby actuating the core carriage movement arm 36 of the linkage lever. The spring bias member 37 is connected to the carriage movement by a lug 38 or the like and to the frame member 23 or a clip 39, as hereinbefore described, thus urging all the respective contacting surfaces into place, thereby preventing any lost motion in the mechanism.

Figure 3 shows in detail the vernier eccentric movement and the cam periphery design. The eccentrically mounted half-round or segmental lug projection 20 is shown contacting a surface 50 of the mating slot 48 located in the actuating arm 43 of the vernier lever member 40. As the lug is rotated eccentrically about its axis by rotation of the disc 21, it is restricted in movement by the tip 52 of the stop 45 which contacts the flat portion 54 of the lug in either of two extremities. The shape and length of the tip 52 may be selected to determine the arc through which the vernier shaft 16 and the eccentric lug 20 will rotate. The segmented portion of the flattened shaft will also be a factor in determining the arc of rotation. The stop member 45 is shown attached by rivets 49 or the like to the vernier actuating arm 43. However, it may be stamped into the metal arm as a projection at one end of the mating slot 48, or formed by any of the known prior art methods.

In some applications a restricted vernier movement may be undesirable, in which case the eccentric lug 20 may be of other suitable shape, for example, cylindrical 20', and in that case the stop member 45 may be eliminated at shown in Figure 3*a*. The vernier shaft then will be continuously rotatable with a resultant smooth cyclic sweeping of the vernier tuning range.

The cam in the embodiment shown has a surface which is designed by so shaping the face 56—57—58 as slowly to insert the tuning core 11 of Figure 1 into the winding 12 according to the requirements of the system for tuning indication or band spread. This surface occupies an arc which represents approximately 300 degrees rotation of the main tuning drive shaft 14. The remaining cam surface 58—56, which represents approximately 60 degrees rotation of the drive shaft 14, supplies a quick return motion to the tuning core, and is not ordinarily used for tuning purposes. Of course, it is to be recognized that the cam surface may be shaped in any suitable manner to impart a desired motion to the driven element without departing from the herein disclosed invention.

The drawing in Figure 4 shows the manner in which the tuner mechanism may be connected for rotary motion such as is desired when the tuning element is a variable capacitor or other tuner of the rotary type 60. The actuating arm 32 of the linkage system is provided in this embodiment with a stud member at the fixed mounting point 38. This stud moves in a longitudinal slot 61 provided in a rotating arm 63 connected to the drive shaft or rotating arm 64 of the variable capacitor. The to-and-fro motion of the actuating arm 32, which occurs when it is pivoted about its axis of rotation 33, is thereby converted to rotary motion of the capacitor plate 65, and tuning is thereby accomplished as easily as in the straight line motion of the tuning core element 11. The relative motion between the actuating arm and the rotating arm could also be afforded by slotting the actuating arm to move with respect to a fixed point on the rotating capacitor arm, or by any other well known sliding type mechanism.

From the foregoing description, it is evident that the invention provides a simple tuning mechanism which is useful in providing either straight line or rotary motion. Not only is the described tuner simple mechanically, but all of its integral parts are easily made of stamped metal or cylindrical members.

Furthermore, it is shown that there are no close manufacturing tolerances which will add to expense, nor is there any trouble encountered in maintaining the parts in cooperative relationship without the occurrence of backlash or lost motion.

From the foregoing description, it will be manifest that a control mechanism in accordance with the invention comprises a compact, smoothly operating tuning means which incorporates an auxiliary tuning control in addition to a main tuning control. The latter feature is clearly made possible by the applicant's structural combination of a movable vernier member and a fixed mounting on the vernier member for connection of a movable point in the main tuning drive linkage so that motion of the vernier lever will afford a corresponding motion to the main drive linkage.

Having thus completely described the nature, construction and manner of operation of the invention, the features of novelty are described in the appended claims. It is to be recognized, however, that the invention is not limited in use to the particular adaptation herein set forth, and that modifications may be made without departing from the true spirit and scope of the invention.

What is claimed is:

1. A mechanism for actuating a radio tuner comprising in combination, a main tuning drive cam element for tuning radio equipment to a band containing a desired signal, a control shaft for actuating said cam element, a vernier tuning control lug eccentrically mounted to rotate about a fixed axis, a separate vernier tuning control shaft for rotating said lug about said axis to tune said radio equipment to a point within said band, a pivoted vernier lever member having a control arm, means provided on said arm for engaging said lug to provide a driving connection therewith, a rocker arm pivotally mounted on and carried by said pivoted vernier member to move therewith in response to rotation of said vernier tuning control shaft and engaging at one end a portion of said cam element to be additionally moved thereby in response to rotation of the first named control shaft, and means operatively connected to said rocker arm at the opposite end for actuating said radio tuner in response to movement of said rocker arm.

2. A tuning drive mechanism for radio equipment comprising in combination, main tuning drive means including a main rotary tuning control shaft having a fixed axis of rotation, a vernier tuning control shaft rotatable about said axis, a vernier tuning control lug eccentrically disposed with respect to said axis and connected to said shaft for rotation therewith, a vernier lever member pivoted at one end to move about a second fixed axis spaced with respect to said first axis and having a control arm, a mating slot on said arm engaging said lug, a movable tuning member, mechanical linkage means connecting said main tuning drive means to said tuning member including a pivoted lever carried at a free end of said vernier lever member, whereby movement of said vernier lever member by rotation of said vernier control shaft in turn causes independent movement of the tuning member.

3. A radio tuning drive mechanism comprising in combination, a main tuning control shaft, a vernier tuning control shaft concentric therewith and having a lug eccentrically mounted at one end shaft, a vernier lever member having two arms pivoted to move about a common axis, a first arm thereof having a slot contiguously engaging said lug, a cam connected to one end of said main tuning control shaft, a cam follower rocker arm pivoted on the second arm of said vernier lever and engaging said cam, a tuning device having a movable element for tuning radio equipment to a desired frequency, a linkage system connected between said rocker arm and the movable tuning element, whereby said device may be tuned by rotation of said main control shaft and additionally tuned by rotation of said vernier control shaft.

4. A mechanism as defined in claim 3 wherein said linkage system includes a single first class lever having two arms pivoted about its fulcrum, one arm engaging one end of the rocker arm and the other arm being connected with the movable tuning element of said adjustable tuning device.

5. A mechanism as defined in claim 2, wherein said adjustable device is rotatably adjustable, in combination with a driving arm rotatable with said device, and a sliding contact whereby said linkage arm engages said driving arm.

6. A mechanism as defined in claim 2 wherein said lug is a flattened stud projection of said vernier shaft, in combination with a stop member having an extended portion affixed to said vernier lever arm so that said extended portion engages the flat side of said lug thereby confining rotation of said vernier shaft to less than 360 degrees.

7. In a radio tuning instrumentality, a fixed sleeve, a hollow tuning shaft concentrically mounted to rotate within said sleeve, a second tuning shaft concentrically mounted to rotate within said hollow shaft, a cam affixed to said first shaft and extending in a plane normal to the axis of said shaft, a rocker arm operable in a plane parallel to said axis and having one end engaging said cam, a lug integral with said second shaft and eccentrically mounted about said axis at one end of said shaft, a lever operable in a plane normal to said axis, connecting means on said lever for engaging said arm, pivoted mounting means for said rocker arm on said lever, and a linkage connected to said rocker arm for adjustably actuating a controlled tuning element.

8. A radio tuning drive mechanism comprising in combination, a main tuning drive shaft, a vernier tuning drive shaft, said shafts being rotatable about a common axis in concentric relation one with respect to the other, a main tuning drive control knob at one end of the first named shaft, a flat disc cam secured to the opposite end of the said main drive shaft, means providing a fixed support for said shafts, a pivoted rocker arm having a curved free end engaging a surface of said cam and being pivotally movable in response to rotation of said cam in a predetermined manner, a mechanical linkage lever mechanically connected with the opposite end of said rocker arm and being spring biased into engagement therewith whereby said linkage lever engages and follows movement of said rocker arm, a vernier lever member pivotally mounted and carrying a pivot shaft for said rocker arm, a pivot axis of the vernier lever member and of the said pivot shaft being substantially at a right angle to each other, an arm on said vernier lever member, and means providing a drive connection between the vernier tuning drive shaft and said arm whereby rotation of said vernier drive shaft imparts movement to said vernier lever member and to said rocker arm independently of movement imparted to said rocker arm by movement of said main drive shaft and said disc cam.

9. A main tuning drive mechanism as described in claim 8 wherein the drive connection between the vernier tuning drive shaft and the arm of the vernier lever member comprises an eccentrically mounted stud extending from the end of the said vernier drive shaft and a cooperating opening in a free end of said arm engaging said stud, and wherein said rocker arm and vernier lever member are spring biased to move in predetermined directions for effecting continuous engagement between the operative elements of said tuning drive mechanism.

10. A radio tuning system comprising in combination, a main tuning drive shaft, a vernier tuning drive shaft, said shafts being rotatable about a common axis in concentric relation one with respect to the other, a main tuning drive control knob at one end of the first named shaft, a flat disc cam secured to the opposite end of the said main drive shaft, means providing a fixed support for said shafts, a pivoted rocker arm having a curved free end engaging a surface of said cam and being pivotally movable in response to rotation of said cam in a predetermined manner, a mechanical linkage lever mechanically connected with the opposite end of said rocker arm and being spring biased into engagement therewith whereby said linkage lever engages and follows movement of said rocker arm, a vernier lever member pivotally mounted and carrying a pivot shaft for said rocker arm, a pivot axis of the vernier lever member and of the said pivot shaft being substantially at a right angle to each other, an arm on said vernier lever member, means providing a drive connection between the vernier tuning drive shaft and said arm, whereby rotation of said vernier drive shaft imparts movement to said vernier lever member and to said rocker arm independently of movement imparted to said rocker arm by movement of said main drive shaft and said disc cam, and a movable radio tuning device connected to said linkage lever to move therewith.

ERNEST D. DAWSON.

REFERENCES CITED

The following references are of record in the file of this patent:

UNITED STATES PATENTS

| Number | Name | Date |
|---|---|---|
| 1,703,574 | Danielson | Feb. 26, 1929 |